United States Patent [19]

Sawada

[11] Patent Number: 5,467,036
[45] Date of Patent: Nov. 14, 1995

[54] INTEGRATED CIRCUIT DEVICE FOR DRIVING ELEMENTS AND LIGHT EMITTING DEVICE

[75] Inventor: Hideki Sawada, Kyoto, Japan

[73] Assignee: Rohm Co., Ltd., Kyoto, Japan

[21] Appl. No.: 263,529

[22] Filed: Jun. 22, 1994

[30] Foreign Application Priority Data

Sep. 1, 1993 [JP] Japan .................................. 5-217098
Sep. 6, 1993 [JP] Japan .................................. 5-220351

[51] Int. Cl.$^6$ .................................................. H03K 3/00
[52] U.S. Cl. ............................................ 327/108; 346/107.6
[58] Field of Search ........................ 346/107 R, 107.1, 346/107.6; 341/154; 307/270; 327/108, 379, 561, 562, 563; 330/252

[56] References Cited

U.S. PATENT DOCUMENTS

| | | | |
|---|---|---|---|
| 4,020,485 | 4/1977 | Busby | 341/154 |
| 4,897,672 | 1/1990 | Horiuchi et al. | 346/107 R |
| 5,008,676 | 4/1991 | Kanoh | 341/154 |
| 5,099,192 | 3/1992 | Thayer et al. | 346/107 R |
| 5,126,740 | 6/1992 | Kawada | 341/154 |
| 5,138,337 | 8/1992 | Ng | 346/107 R |
| 5,175,548 | 12/1992 | Kawada | 341/154 |
| 5,220,348 | 6/1993 | D'Aurelio | 346/107 R |
| 5,233,337 | 8/1993 | Takahashi | 346/107 R |

Primary Examiner—Timothy P. Callahan
Assistant Examiner—Jeffrey Zweizig
Attorney, Agent, or Firm—Brumbaugh, Graves, Donohue & Raymond

[57] ABSTRACT

An integrated circuit device comprises a first external reference voltage pin and a second external reference voltage pin. External reference voltages are applied to these pins to provide the supply voltage of a D/A converter and the output of the D/A converter is fed into a gate of a driving MOSFET via an inverting circuit and a logic gate. In one embodiment, resistors in a first resistor group have one end connected to first external reference voltage pins and resistors in a second resistor group have one end connected to second external reference voltage pins. The other ends of the first and second resistor groups are connected in common and the potential at the common connection point is applied via an inverting circuit and a gate circuit to a gate of a MOSFET.

8 Claims, 7 Drawing Sheets

INTEGRATED CIRCUIT DEVICE FOR DRIVING ELEMENTS AND LIGHT EMITTING DEVICE

BACKGROUND OF THE INVENTION

1. Field of the Invention

This invention relates to an integrated circuit device used for driving light emitting elements for use in an optical printer, an image sensor, etc., and heating elements of a thermal head, and more particularly to an integrated circuit device effective when a drive current of driven elements is adjusted.

2. Discussion of the Related Art

For example, an optical printer head includes a linear array of a number of LEDs (light emitting diodes) as light emitting elements on a printed wiring board and is driven by several drive ICs (drive integrated circuits). One of the drive ICs drives, for example, 64 LEDs and therefore contains a shift register and a latch circuit each having bit cells corresponding to the 64 LEDs and as many logic gates and as many MOSFETs (metal oxide semiconductor field effect transistors) as the number of LEDs. In the LED drive IC of this type, drive current of the drive MOSFET, namely, current flowing through the LED varies due to variation in supplied gate potential, IC characteristics, etc., and the light emitting amounts of the LEDs differ from each other, lowering the print quality. To avoid this disadvantage, the supply potential to each drive MOSFET gate is adjusted for each IC. A D/A converter is used as a conventional method for adjusting the gate potential.

Figure 1:
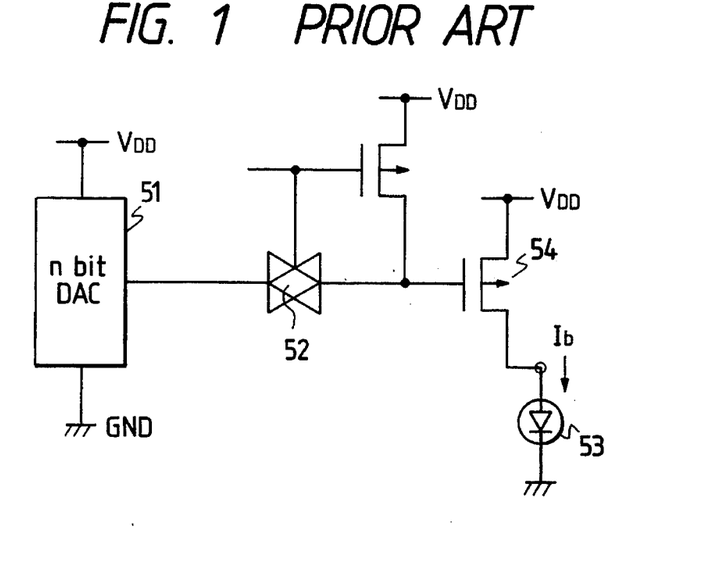
FIG. 1 is a circuit diagram showing a conventional $G_S$ select circuit.

FIG. 1 shows a specific circuit therefor, wherein an output signal of an n-bit D/A converter 51 is applied via a logic gate circuit 52 to a gate of a MOSFET 54 for driving an LED 53. The D/A converter 51 outputs an analog voltage $V_0$ corresponding to a digital setting in the range of 0 V to the supply voltage $V_{DD}$. When the logical gate circuit 52 is enabled, the output voltage $V_0$ is applied to the gate of the MOSFET 54 to allow a drive current $I_L$ corresponding to the voltage $V_0$ to flow.

The above-mentioned conventional circuit device uses the D/A converter for adjusting the potential supplied to the gate of the drive MOSFET, and the power supply voltage supplied to the D/A converter is also $V_{DD}$ as a matter of course. By the way, when a large number of driven elements are driven at a time, a large drive current flows, thus the supply voltage $V_{DD}$ often fluctuates. As the supply voltage $V_{DD}$ fluctuates, the source-to-drain current of the drive MOSFET also fluctuates. Thus, the drive current of the driven element is not stabilized and fluctuates in response to fluctuation of the supply voltage.

SUMMARY OF THE INVENTION

It is therefore an object of the invention to provide an integrated circuit device capable of allowing stabilized drive current to flow even when the supply voltage fluctuates.

To allow stabilized drive current to flow, a stabilized external reference voltage may be used apart from the supply voltage. A positive external reference voltage with respect to the GND level can be obtained more easily than a negative external reference voltage.

It is therefore another object of the invention to provide an integrated circuit-device capable of using a positive voltage with respect to the GND level as an external reference voltage.

To solve the above-mentioned problems, the present invention has been achieved by provision of an integrated circuit device for driving elements comprising drive circuits provided for driving a plurality of driven elements on a one-to-one basis and each including one or more driving field effect transistors, a D/A converter for supplying a set voltage to gates of the driving field effect transistors, a first external reference voltage terminal, and a second external reference voltage terminal wherein voltage across the first and second external reference voltage terminals is supplied as a supply voltage of the D\A converter.

The integrated circuit device may further include an inverting circuit between an output terminal of the D/A converter and a gate potential supply circuit of the driving field effect transistor so that positive potential can be used as an external reference voltage.

Further, the invention has been achieved by provision of an integrated circuit device for driving elements including a plurality of field effect transistors provided for driving a plurality of driven elements on a one-to-one basis, a first external reference voltage terminal group, a second external reference voltage terminal group, a first group of resistors connected between the first external reference voltage terminal group and a gate potential supply circuit, and a second group of resistors of different resistance values having one end connected in common to one end of the first resistor group on a gate potential supply circuit side and having the other end connected to the second external reference voltage terminal group.

The integrated circuit device may further include an inverting circuit between one end connected in common to the first and second resistor groups and the gate potential supply circuit. The integrated circuit device for driving light emitting elements includes an inverting circuit so that positive potential can be used as an external reference voltage.

With the integrated circuit device for driving the elements, stabilized voltage in the range of negative to positive is supplied to the first and second external reference voltage terminals, thereby supplying a voltage separate from the supply voltage VDD to the gates of the driving field effect transistors. Thus, even if the supply voltage $V_{DD}$ fluctuates, the source-to-gate voltage $V_{GS}$ of the driving field effect transistor can be kept constant. Therefore, drive current is also stabilized.

BRIEF DESCRIPTION OF THE DRAWINGS

The accompanying drawings, which are incorporated in and constitute a part of this specification, illustrate embodiments of the invention, and together with the description, serve to explain the objects, advantages and principles of the invention. In the drawings.

DETAILED DESCRIPTION OF THE PREFERRED EMBODIMENTS

Referring now to the accompanying drawings, preferred embodiments of the invention will be described in more detail.

Figure 3:
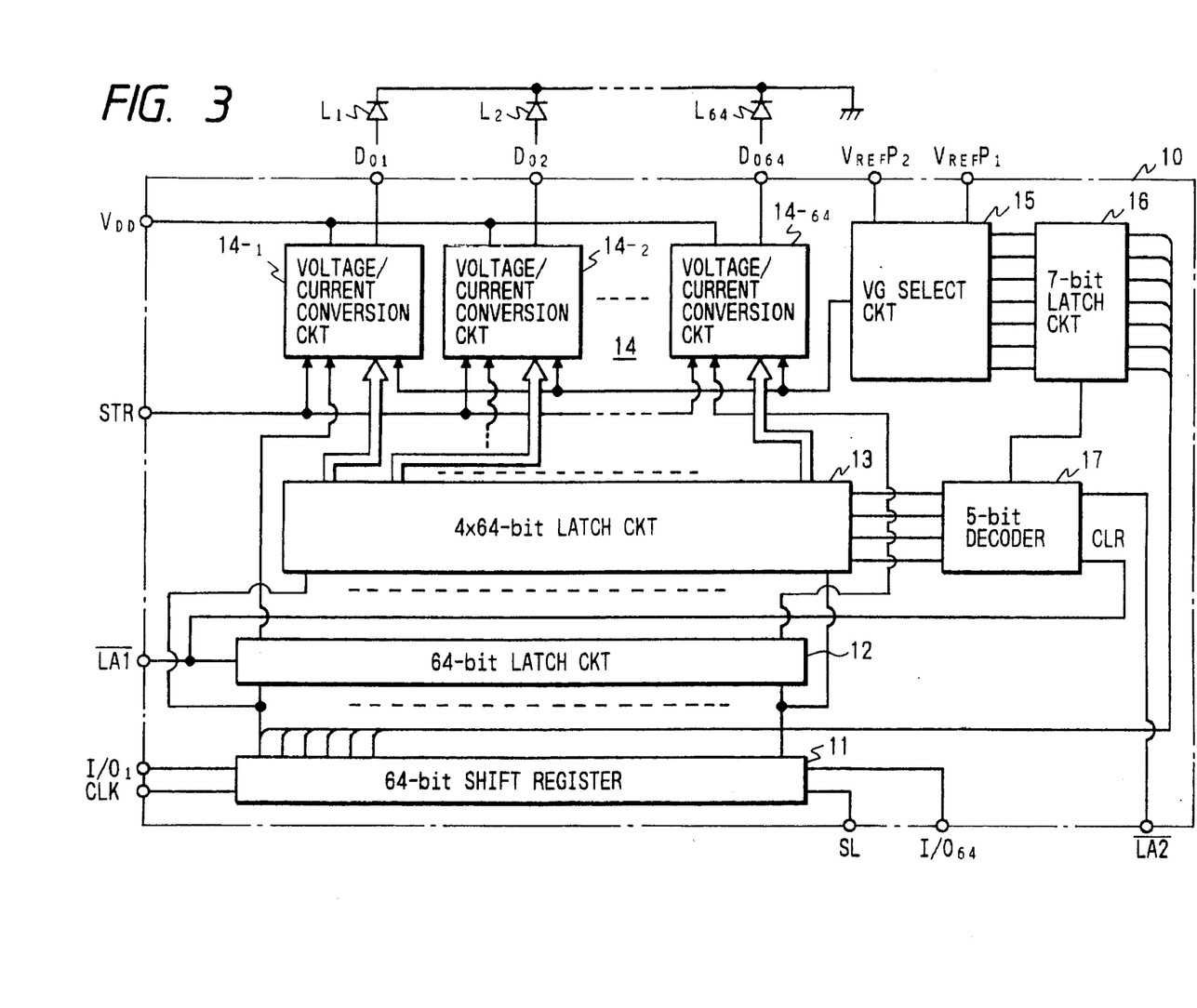
FIG. 3 is a block diagram showing the configuration of the LED driving integrated circuit according to the invention.

FIG. 3 is a block diagram showing the circuit configuration of an LED driving integrated circuit 10 according to one embodiment of the invention. The integrated circuit 10 includes a shift register 11 which consists of 64 bit storage cells for storing data input through an I/01 pin, a latch circuit 12 which consists of 64 bit latch cells for latching each bit storage cell output of the shift register 11, a 4× 64-bit latch circuit 13 for storing data indicating how much current flows into each of the 64 LEDs and for each LED, voltage/current conversion circuits (drive circuits) 14 ($14_{-1}$ to $14_{-64}$), each corresponding to each LED on a one-to-one basis, for allowing drive current corresponding to 4-bit data value to flow from the latch circuit 13 to $LEDL_1$ to $LEDL_{64}$, a $V_G$ select circuit 15 for applying a preset voltage to each MOSFET gate for driving the voltage/current conversion circuits 14, a 7-bit latch circuit 16 for inputting a digital set value to the $V_G$ select circuit 15, and a 5-bit decoder 17 for defining the latch timing into the latch circuits 15 and 16.

Figure 4:
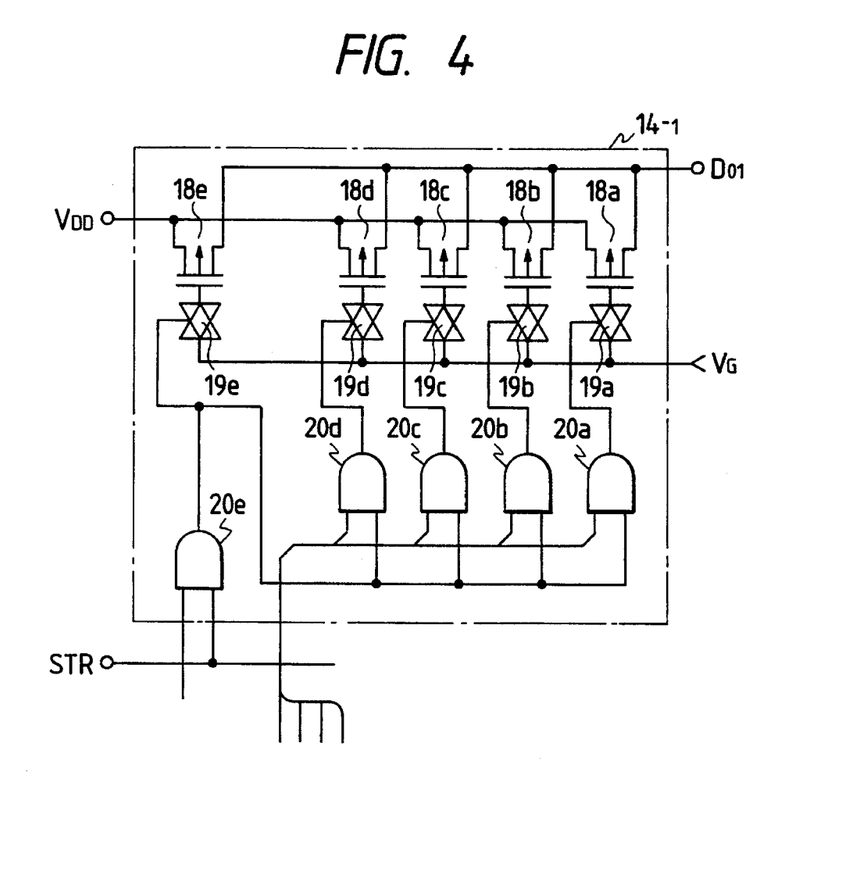
FIG. 4 is a circuit diagram showing a specific example of a voltage/current conversion circuit of the integrated circuit according to the invention.

FIG. 4 shows a specific circuit of the voltage/current conversion circuit $14_{-1}$. The voltage/current conversion circuit $14_{-1}$ uses five MOSFETs 18a to 18e for driving one LED. The sources of the MOSFETs 18a–18e are connected to power supply voltage $V_{DD}$ and the drains thereof are in common connected to an output pin $D_{01}$ connected to the LED. Voltage $V_G$ from the $V_G$ select circuit 15 is applied to the gates of the MOSFETs 18a–18e via gate circuits 19a to 19e, respectively. Enabling or disenabling the gate circuits 19a–19e is determined by logical signals from AND gates 20a to 20e. The AND gate circuit 20e ANDs a strobe signal STR and an output of the first bit of the shift register 11. The AND gate circuits 20a–20d AND the output signal of the AND gate 20e and each of the first four bits latched in the latch circuit 13. To allow the most current to flow into the output pin $D_{01}$, all the gate circuits 19a–19e are enabled. To allow the least current to flow thereinto, only the gate circuit 19e is enabled. Proper current can flow by selecting the gate circuits 19a–19b to be enabled. Of course, the entire current can be adjusted according to the magnitude of the signal voltage $V_G$. Each of the other voltage/current conversion circuits $14_{-2}$ to $14_{-64}$ has the same configuration as and performs the same operation as the voltage/current conversion circuit $14_{-1}$.

Figure 2:
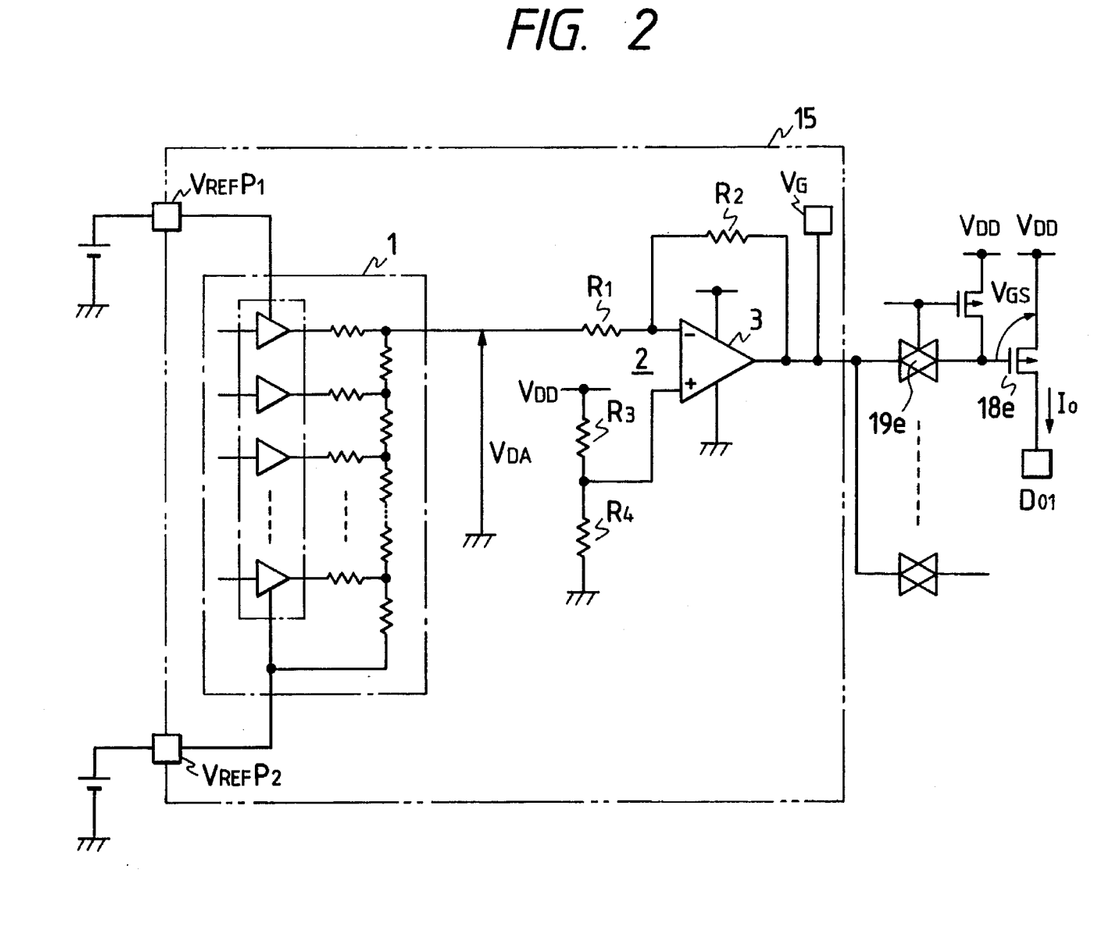
FIG. 2 is a circuit connection diagram of a $G_S$ select circuit, which constitutes an LED driving integrated circuit according to the invention.

The integrated circuit 10 according to the embodiment is most characterized by the $V_G$ select (chip correction) circuit 15. Next, a specific circuit of the $V_G$ select circuit 15 will be described. As shown in FIG. 2, the $V_G$ select circuit 15 includes a pin $V_{REF} P_1$ for applying external reference voltage $V_{REF}(+)$, a pin $V_{REF} P_2$ for applying external reference voltage $V_{REF}(-)$, a D/A converter 1, and an inverting circuit 2. A well-known R-2R ladder type is used as the D/A converter 1 per se and voltage between the external reference voltage pins $V_{REF} P_1$ and $V_{REF} P_2$ is used as the supply voltage. The inverting circuit 2 includes an OP amplifier 3, a resistor $R_1$ connected between an output terminal of the D/A converter 1 and an inversion input terminal (−) of the OP amplifier 3, a resistor $R_2$ connected between the inversion input terminal (−) and an output terminal of the OP amplifier 3, and resistors $R_3$ and $R_4$ connected between the supply voltage $V_{DD}$ and GND and having a junction point connected to a non-inversion input pin (+) of the OP amplifier 3 where $R_1=R_2=R_3=R_4=R$.

Figure 5:
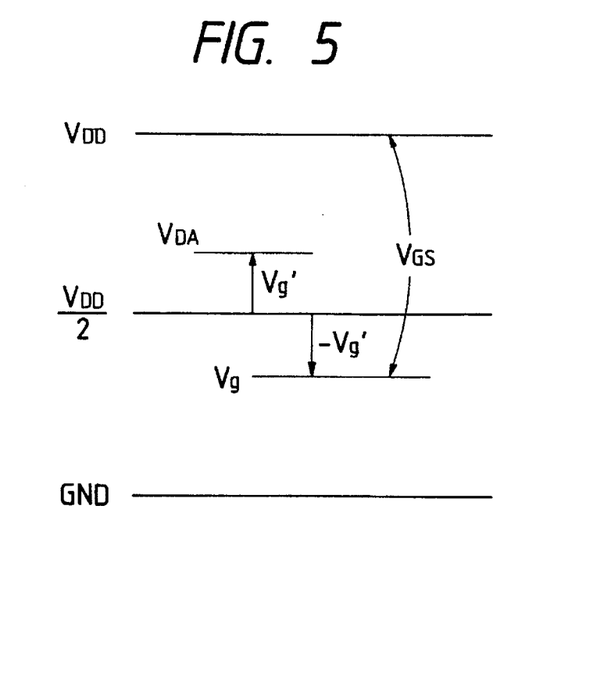
FIG. 5 is a characteristic chart for illustrating operation of the $G_S$ select circuit.

The operation of the $V_G$ select circuit 15 will be described with reference to FIG. 5. Now, assume that the reference voltage applied to the first external reference voltage pin $V_{REF} P_1$ is $V_{REF}(+)$ and that the reference voltage applied to the second external reference voltage pin $V_{REF} P_2$ is $V_{REF}(-)$.

When the external reference voltages $V_{REF}(+)$ and $V_{REF}(-)$ [=GND] are applied, a voltage $V_{DA}$ is generated from the D/A converter 1, and is applied via the resistor $R_1$ to the inversion input pin (−) of the OP amplifier 3. At the time, a voltage (½ $V_{DD}$ because $R_3=R_4$) provided by dividing the circuit supply voltage $V_{DD}$ is applied to the non-inversion input terminal (+) of the OP amplifier 3. The relationship of these voltages is shown in FIG. 5. Assuming that the voltage of $V_{DA}-V_{DD}/2$ is Vg', a voltage Vg which is lower by Vg' than the non-inversion input pin (+) voltage $V_{DD}/2$ is generated at the output terminal of the OP amplifier 3, which is represented as $$Vg=V_{DD}/2-Vg'=V_{DD}/2-(V_{DA}-V_{DD}/2)$$

The gate-to-source voltage $V_{GS}$ of a drive MOS transistor 15a is represented by $$V_{GS}=V_{DD}-Vg=V_{DD}-(V_{DD}-V_{DA})=V_{DA}$$

Thus, the external reference voltages $V_{REF}(+)$ and $V_{REF}(-)$ are applied and the voltage $V_{DA}$ is output from the D/A converter 1, thereby determining the voltage $V_{GS}$. Therefore, if the stabilized voltage $V_{DA}$ is used, although the supply voltage $V_{DD}$ fluctuates, the gate-to-source voltage $V_{GS}$ does not change and the drive current does not fluctuate either.

Figure 6:
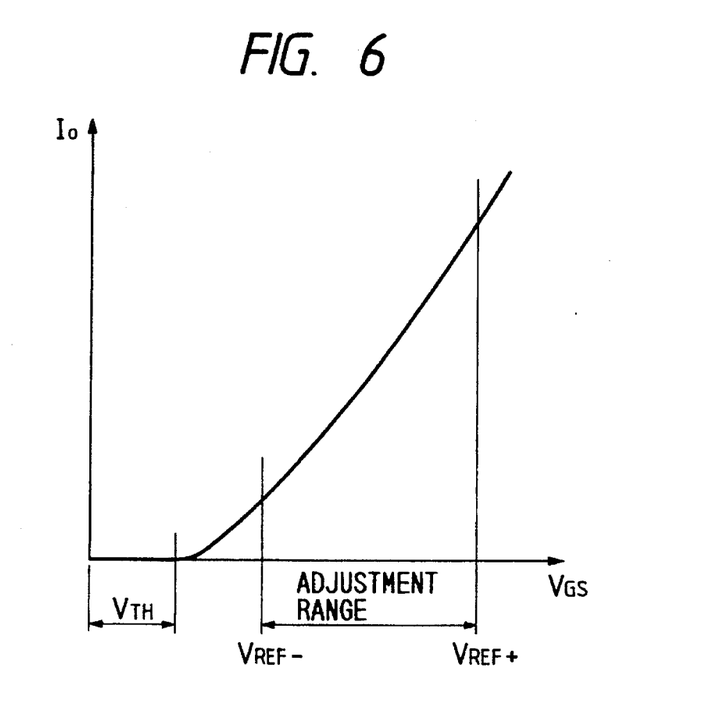
FIG. 6 is a characteristic chart showing the relationship between source-to-gate voltage of a driving field effect transistor of the integrated circuit according to the invention and output current.

As shown in FIG. 6, if an output signal of the conventional D/A converter is applied to provide a gate potential, an invalid adjustment range $V_{TH}$ occurs. However, in FIG. 6, the origin is $V_{DD}$ ($V_{GS}=0$ V) and the output current $I_0$ does not flow in the range of $V_{GS}=0$ to $V_{GS}=V_{TH}$, thus $V_{REF}(-)$ is used as a cut-off so as not to select a lower gate potential. If the upper limit of the output current to be adjusted is determined by $V_{REF}(+)$, $V_{GS}$ can be adjusted in the range of $V_{REF}(+)$ to $V_{REF}(-)$.

Next, the whole operation of the integrated circuit according to the embodiment will be described. First, 4×64-bit data indicating into which of the MOSFETs 18a–18d of each of the voltage/current conversion circuits $14_{-1}$ to $14_{-64}$ a current flows for each of the LEDs L1–L64 is stored 64 bits at a time in the shift register 11 in sequence and is then latched in the latch circuit 13 according to the specification bit of the decoder 17. During this operation the data is latched in the latch circuit 13 bit-by-bit by shifting the bit output of the decoder 17. When bit correction data of 4×64 bits is latched in the latch circuit 13, the decoder 17 energizes the latch circuit 16 at output of the fifth bit. At that time, 7-bit $V_G$ select data is stored in the shift register 11, and is latched in the latch circuit 16 at output of the fifth bit of the decoder 17. Thus, the bit correction data at initialization is set and stored in the latch circuit 13 and the chip correction data is set and stored in the latch circuit 16.

Next, in the normal print operation, in the integrated circuit 10, 64-bit print data is stored in the shift register 11 and in response to a latch signal LA1 bar, is latched in the latch circuit 12. Since bit output signals of the latch circuit 12 are fed into the voltage/current conversion circuits $14_{-1}$ to $14_{-64}$, the AND gates 20e corresponding to only the bits indicating energization when the strobe signal STR is input produce a high signal, and their corresponding gates 19e are enabled. The AND gates 20a–20d corresponding to only high bits stored in the latch circuit 13 output a high signal, and their corresponding gates 19a–19d are enabled. For example, assuming that the bit correction data corresponding to the leftmost LED output $D_{01}$ is "1001", the gate 19e and the gates 19a and 19d are enabled. Select voltage $V_G$ is applied via the enabled gates to the gates of the MOSFETs 18a, 18d, and 18e, for example, in the above example, and current in response to the select voltage $V_G$ flows through the supply voltage $V_{DD}$, MOSFETs 18a, 18b, and 18d, output pin $D_{01}$, and LED $L_1$ in order.

Although the embodiment described above refer to LED driving as an example, the invention can also be applied to driving of the heating elements of a thermal head, etc.

Figure 8:
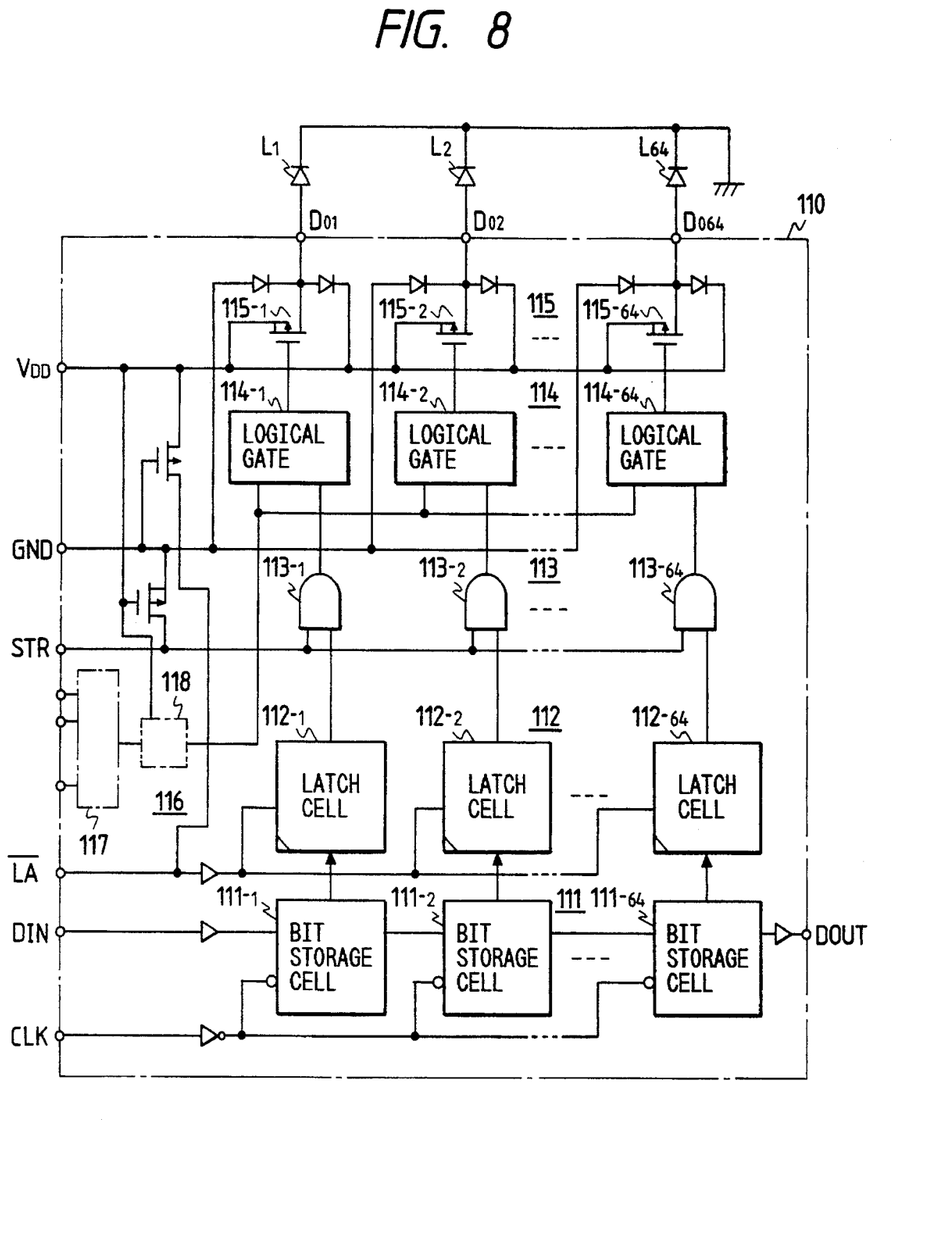
FIG. 8 is a block diagram showing the configuration of the LED driving integrated circuit according to the invention.

FIG. 8 is a block diagram showing the circuit configuration of an LED driving integrated circuit 110 according to another embodiment of the invention. The integrated circuit 110 comprises a shift register 111 which consists of bit storage cells $111_{-1}$ to $111_{-64}$ for storing data input through a DIN pin, a latch circuit 112 which consists of latch cells $112_{-1}$ to $112_{-64}$ for latching each bit storage cell output signal of the shift register 111, an AND circuit section 113 which consists of AND gates $113_{-1}$ to $113_{-64}$ for outputting each latch signal of the latch circuit 112 in synchronization with a strobe signal applied to an STR pin, a logical circuit section 114 which consists of logical gates $114_{-1}$ to $114_{-64}$ for outputting a potential of a $V_G$ pin when an output of the AND gate $113_{-1}$ to $113_{-64}$ is "1" (high), a drive circuit section 115 which consists of drive MOSFETs $115_{-1}$ to $115_{-64}$ each being turned on when receiving an output signal $V_G$ of each logical gate of the logical circuit section 114, and a gate potential setting circuit section 116 which consists of a resistor circuit section 117 and an inverting circuit 118 for adjusting the $V_G$ potential input to the gates of the MOSFETs $115_{-1}$ to $115_{-64}$. The LEDs $L_1$ to $L_{64}$ of an LED print head are connected to the output pins $DO_1$ to $DO_{64}$ of the MOSFETs $115_{-1}$ to $115_{-64}$ on a one-to-one basis.

When input data is input to the integrated circuit 110 through the DIN pin, the data is stored in the bit storage cells $111_{-1}$ to $111_{-64}$ of the shift register 111. As the data stored in the shift register 111, a "1" is stored in the bit cells for allowing current to flow into the respective LEDs of the LED head and driving them for print operation and a "0" is stored in the bit cells for suppressing print operation. When a latch signal is input to an LA bar pin, outputs of the bit storage cells of the shift register 111 are latched in the latch cells $112_{-1}$ to $112_{-64}$ of the latch circuit 112. At the time at which a strobe signal is input to the STR pin, the data in the latch cells $112_{-1}$ to $112_{-64}$ is input through the AND gates $113_{-1}$ to $113_{-64}$ of the AND circuit section 113 to the logical gates $114_{-1}$ to $114_{-64}$ of the logical circuit section 114. When a "1" signal is the input to the AND gates $113_{-1}$ to $113_{-64}$, the logical gates $114_{-1}$ to $114_{-64}$ of the logical circuit section 114 will supply an output which is the potential supplied to the $V_G$ pin.

When a "0" is the input, the supply voltage $V_{DD}$ is the output. This potential is supplied to the gates of the drive MOSFETs $115_{-1}$ to $115_{-64}$ from the logical gates $114_{-1}$ to $114_{-64}$ of the logical circuit section 114. When the $V_G$ potential is input, $V_{DD}$-$V_G$ voltage is the input to the gate, and only the MOSFETs to which the voltage is supplied are turned on. Thus, the drive current flows into the anodes of the LEDs through the MOSFETs, which have been turned on according to the drive voltage $V_{DD}$, from the connected output pins, causing the LEDs to emit light for a print operation.

The drive current flowing into the LEDs $L_1$–$L_{64}$ via the MOSFETs $115_{-1}$ to $115_{-64}$ varies depending on the gate potential $V_G$ and also on the characteristics of the integrated circuit 110. Thus, the gate potential setting circuit section 116 adjusts the gate potential input to the $V_G$ pin for making a constant average amount of light of the LED head corresponding to the integrated circuit 110. The invention is characterized by the gate potential setting circuit section 116.

Figure 7:
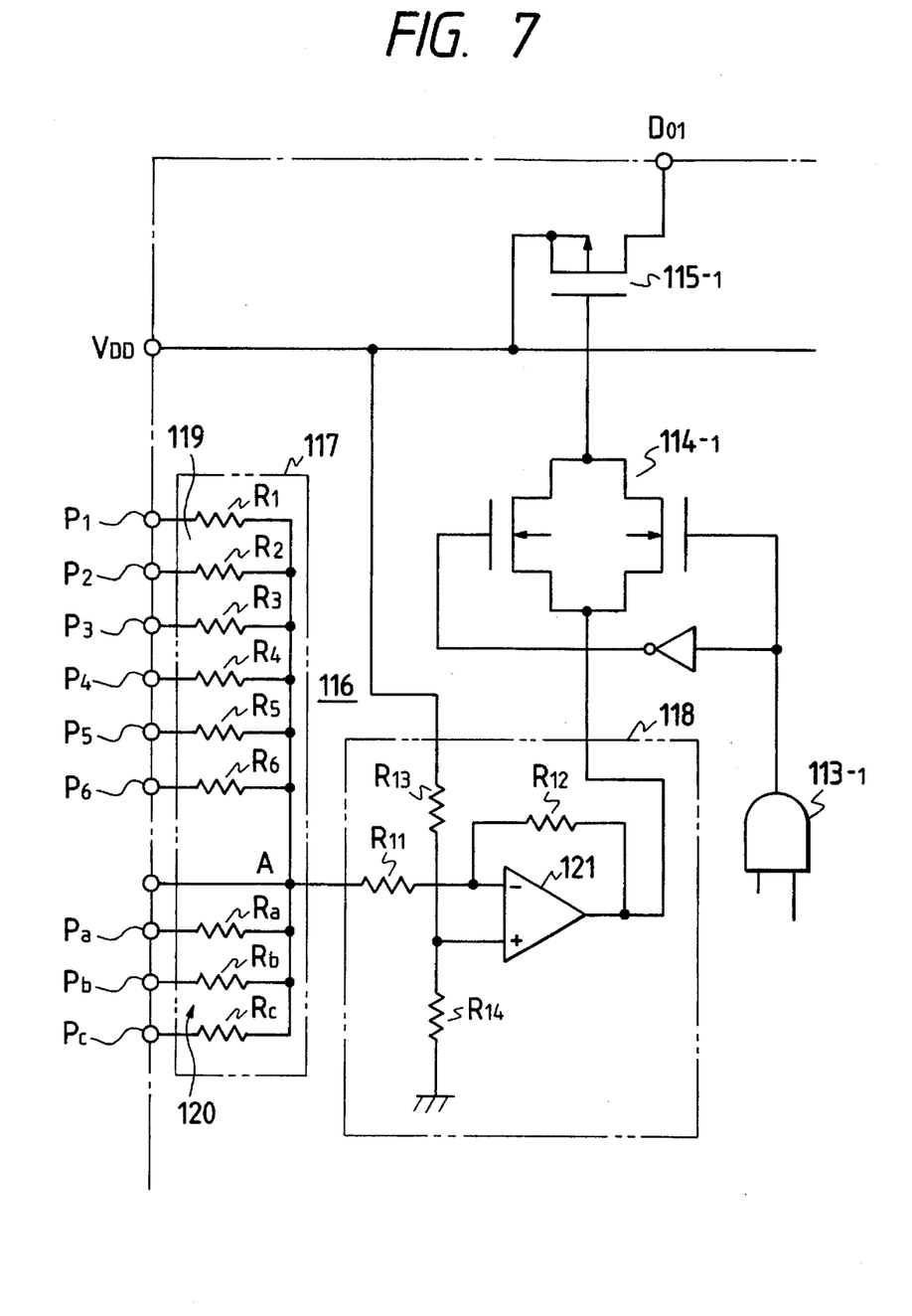
FIG. 7 is a circuit diagram showing a main circuit of an integrated circuit device according to the invention.

Next, the gate potential setting circuit section 116 will be described in more detail with reference to FIG. 7. The resistor circuit section 117 of the gate potential setting circuit section 116 is made up of a first resistor group 119 consisting of six resistors $R_1$ to $R_6$ and a second resistor group 120 consisting of three resistors Ra, Rb, and Rc, as shown in FIG. 7. The resistors R1 to R6 in the first resistor group 119 have one end connected to first external reference voltage pins $P_1$ to $P_6$, respectively, and the resistors Ra, Rb, and Rc in the second resistor group 120 have one end connected to second external reference voltage pins Pa, Pb, and Pc, respectively. The resistors in the first and second resistor groups 119 and 120 have the other end connected to a point A in common, and the common junction point A is connected to the inverting circuit 118.

The inverting circuit 118 includes an OP amplifier 121, a resistor $R_{11}$ connected between the common junction point A and an inversion input terminal (−) of the OP amplifier 121, a resistor $R_{12}$ connected between the inversion input terminal (−) and an output terminal of the OP amplifier 121, and resistors $R_{13}$ and $R_{14}$ for dividing the supply voltage $V_{DD}$ to apply the resultant divided voltage to a non-inversion input terminal (+) of the OP amplifier 121 where the resistors $R_{11}$ and $R_{12}$ are set to an equal resistance value and the resistors $R_{13}$ and $R_{14}$ are set to an equal resistance value, respectively.

Figure 9:
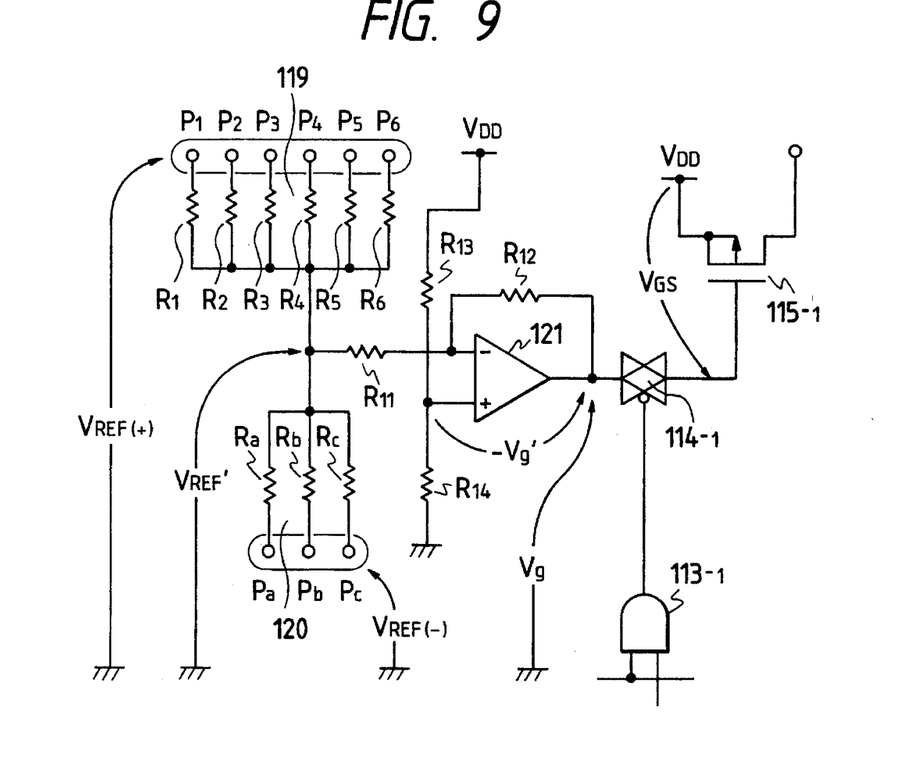
FIG. 9 is a circuit diagram for illustrating the operation of the main circuit shown in FIG. 7.
Figure 10:
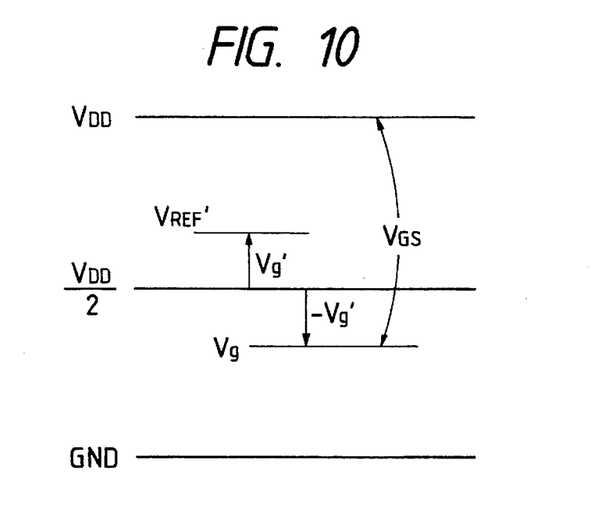
FIG. 10 is a chart for illustrating potential levels of the blocks shown in FIG. 9.

The operation of the gate potential setting circuit section 116 will be described with reference to FIGS. 9 and 10. Now, assume that the reference voltage applied to the first external reference voltage pins $P_1$–$P_6$ is $V_{REF}(+)$ and that the reference voltage applied to the second external reference voltage pins $P_a$–$P_c$ is $V_{REF}(-)$. The reference voltage may be applied to some or all of the first external reference voltage pins $P_1$–$P_6$; likewise, the reference voltage may be applied to some or all of the second external reference voltage pins $P_a$–$P_c$.

When the external reference voltages $V_{REF}(+)$ and $V_{REF}(-)$ [=GND] are applied, it is divided by means of the respective combined resistors in the first and second resistor groups 119 and 120 to generate voltage $V_{REF}'$ at the point A. The voltage $V_{REF}'$ is applied via the resistor $R_{11}$ to the inversion input pin (−) of the OP amplifier 121. At the time, voltage provided by dividing the circuit supply voltage $V_{DD}$ (½ $V_{DD}$ because $R_{13}$=$R_{14}$) is applied to the non-inversion input terminal (+) of the OP amplifier 121. Their level relationship is shown in FIG. 10. Assuming that voltage of $V_{REF}'$−$V_{DD}/2$ is Vg', voltage Vg lower by Vg' than the non-inversion input pin (+) is generated at the output terminal of the OP amplifier 121, which is represented as $$\begin{aligned} Vg &= V_{DD}/2 - Vg' = V_{DD}/2 - (V_{REF}' - V_{DD}/2) \\ &= V_{DD} - V_{REF}' \end{aligned}$$

The gate-to-source voltage $V_{GS}$ of the drive MOSFET $115_{-1}$ is represented by $$V_{GS} = V_{DD} - Vg = V_{DD} - (V_{DD} - V_{REF}') = V_{REF}'$$

Thus, $V_{GS}$ is determined by the voltage $V_{REF}'$ generated by dividing the external reference voltages $V_{REF}(+)$ and $V_{REF}(-)$. Therefore, if stabilized voltage $V_{REF}'$ is used, even although the supply voltage $V_{DD}$ fluctuates, the gate-source voltage $V_{GS}$ does not change and the drive current does not fluctuate either.

Although the embodiment takes driving an LED print head as an example, the invention can also be applied to driving an image sensor and other light emitting devices and further driving heating elements of a thermal head, etc.

As was described above, the integrated circuit device according to the invention comprises a first external reference voltage terminal group, a second external reference voltage terminal group, a first group of resistors connected between the first external reference voltage terminal group and a gate potential supply circuit of a drive field effect transistor, and a second group of resistors of different resistance values having one end connected in common to one end of the first resistor group on a gate potential supply circuit side and having the other end connected to the second external reference voltage terminal group. Thus, stabilized external reference voltage rather than the circuit supply voltage $V_{DD}$ is given to the first and second reference voltage terminal groups and divided voltage by means of the first and second resistor groups is given as the gate-source voltage of the driving field effect transistor. Therefore, even if the circuit supply voltage $V_{DD}$ fluctuates, the gate-source voltage does not fluctuate and stabilized drive current can be flowed. The upper and lower limits of the adjustment range of gate potential of the drive field effect transistor can be set by the reference voltage applied to the first and second external reference voltage terminal groups, and steps of drive current can be made variable.

An inverting circuit is further disposed between the voltage dividing point of the first and second resistor groups and the gate potential supply circuit, whereby positive potential with respect to GND can be used as the external reference voltage; reference voltage can be easily produced.

The integrated circuit device according to the invention comprises first and second external reference voltage terminals wherein voltage across the first and second external reference voltage terminals is supplied as supply voltage of the D/A converter. Thus, stabilized external reference voltage rather than the circuit supply voltage VDD is given to the D/A converter as supply voltage, and voltage is given as the gate-to-source voltage of the driving field effect transistor. Therefore, even if the circuit supply voltage $V_{DD}$ fluctuates, the gate-to-source voltage does not fluctuate and stabilized drive current can be flowed. The adjustment range and steps of output current can be made variable by the external reference voltage, and fine setting of the drive current is enabled by changing the external reference voltage value.

An inverting circuit is further disposed between output of the D/A converter and the gate potential supply circuit, whereby positive potential with respect to GND can be used as the external reference voltage; reference voltage can be easily produced.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An integrated circuit device for driving elements, comprising:

driver circuits for individually driving a plurality of elements to be driven;

a selector circuit for supplying a set voltage to said driver circuits;

first and second external reference voltage terminals for supplying voltage to said selector circuit as a reference voltage; and an inverting circuit in the selector circuit comprising an operational amplifier having an inversion input terminal to receive reference voltage supplied from the first and second external reference voltage terminals and a noninversion input terminal to receive voltage from a voltage divider connected between a supply voltage and ground and an output terminal for providing said set voltage.

2. An integrated circuit device as claimed in claim 1, wherein said driver circuits include at least one drive field effect transistor, respectively and said selector circuit supplies the set voltage to a gate of said drive field effect transistor.

3. An integrated circuit device as claimed in claim 1, wherein said selector circuit comprises a D/A converter.

4. An integrated circuit as claimed in claim 1, wherein said driver circuits include at least one drive field effect transistor, respectively and said selector circuit supplies the set voltage to a gate of said drive field effect transistor, and wherein said selector circuit comprises a D/A converter.

5. An integrated circuit device as claimed in claim 4, further comprising a gate potential supply circuit for said drive field effect transistor, and wherein the inverting circuit is provided between an output terminal of said D/A converter and said gate potential supply circuit.

6. A light emitting device, comprising:

a plurality of light emitting elements provided in parallel with each other;

driver circuits for individually driving said plurality of light emitting elements, each of said driver circuits including at least one drive field effect transistor;

a D/A converter for supplying a set voltage to gates of said driver circuits;

first and second external reference voltage terminals for supplying voltage to said D/A converter as a reference voltage, respectively; and an inverting circuit in the D/A converter comprising an operational amplifier having an inversion input terminal to receive reference voltage supplied from the first and second external reference voltage terminals and a noninversion input terminal to receive voltage from a voltage divider connected between a supply voltage and ground and an output terminal for providing said set voltage.

7. An integrated circuit device for driving elements, comprising:

a plurality of field effect transistors for individually driving a plurality of elements to be driven;

a first external reference voltage terminal group;

a second external reference voltage terminal group;

a gate potential supply circuit;

a first group of resistors connected between said first external reference voltage terminal group and said gate potential supply circuit; and a second group of resistors of different resistance values having one end connected in common to one end of said first resistor group on the gate potential supply circuit side and having the other end connected to said second external reference voltage terminal group; and an inverting circuit in the gate potential supply circuit comprising an operational amplifier having an inversion input terminal to receive reference voltage from the common end of the first and second groups of resistors and a noninversion input terminal to receive voltage from a voltage divider connected between a supply voltage and ground and an output terminal for providing an output from the gate potential supply circuit.

8. A light emitting device, comprising:

a plurality of light emitting elements;

a plurality of field effect transistors for individually driving said plurality of light emitting elements;

a first external reference voltage terminal group;

a second external reference voltage terminal group;

a gate potential supply circuit;

a first group of resistors connected between said first external reference voltage terminal group and said gate potential supply circuit;

a second group of resistors of different resistance values having one end connected in common to one end of said first resistor group on the gate potential supply circuit side and having the other end connected to said second external reference voltage terminal group; and an inverting circuit in the gate potential supply circuit comprising an operational amplifier having an inversion input terminal to receive reference voltage from the common end of the first and second groups of resistors and a noninversion input terminal to receive voltage from a voltage divider connected between a supply voltage and ground and an output terminal for providing an output from the gate potential supply circuit.

* * * * *